United States Patent [19]

Perry

[11] Patent Number: 4,528,615
[45] Date of Patent: Jul. 9, 1985

[54] REPEATER HOUSING AND CIRCUIT MOUNTING STRUCTURE

[75] Inventor: Michael W. Perry, Ocean, N.J.

[73] Assignee: AT&T Bell Laboratories, Murray Hill, N.J.

[21] Appl. No.: 495,065

[22] Filed: May 13, 1983

[51] Int. Cl.³ .............................................. H05K 7/20
[52] U.S. Cl. ................................. 361/386; 174/70 S; 179/16 E; 361/387
[58] Field of Search .......................... 179/170 R, 16 E; 174/70 S, 35 R, 16 HS; 361/331, 380, 386–389, 395, 399, 412, 424, 417, 419, 420; 165/104.33, 80

[56] References Cited

U.S. PATENT DOCUMENTS

| | | | |
|---|---|---|---|
| 2,471,046 | 5/1949 | Smith | 174/70 S |
| 2,471,465 | 5/1949 | Van Hasselt | 174/70 S |
| 4,400,858 | 8/1983 | Goiffen | 361/386 |

FOREIGN PATENT DOCUMENTS 2430070  2/1980  France ............................. 174/70 S Primary Examiner—G. P. Tolin
Attorney, Agent, or Firm—Richard B. Havill

[57] ABSTRACT

An undersea communication cable system repeater housing and electronic circuits mounting structure includes a vessel having an electrical insulator covering an inside surface of the vessel. A heat conducting structure for mounting electronic circuits includes separable segments having surface areas contoured to match an inside surface of the electrical insulator. Electronic circuits are mounted on the heat conducting structure. The separable segments of the heat conducting structure are inserted into the vessel as a unit with resilient devices interposed between the segments for pressing the contoured surface areas into intimate contact with the inside surface of the electrical insulator.

4 Claims, 5 Drawing Figures

REPEATER HOUSING AND CIRCUIT MOUNTING STRUCTURE

BACKGROUND OF THE INVENTION

The invention relates to a repeater housing and circuit mounting structure which can be more particularly described as a repeater housing and circuit mounting structure designed for low temperature rise and high voltage isolation.

In the prior art, undersea communication cable repeater housings have been designed of high strength metals for withstanding stresses of sea bottom pressure and of cable deployment and recovery. Substantial electrical insulation isolates very high voltages, used for powering the electronic circuits, from the repeater housing. Ambient temperature within the repeater housing is high enough that electronic components used in the repeaters are specially selected rugged components able to operate within the repeater housing for twenty or more years.

A problem with the prior art repeater housing and circuit mounting structure arises when electronics for a higher speed optical fiber transmission system are to be housed therein. The electronics are newer integrated circuits and other components which generate more heat and have less long term reliability. Their reliability can be extended significantly by limiting the ambient temperature rise in the repeater housing where they are located.

SUMMARY OF THE INVENTION

This problem is solved by a repeater housing and electronic circuits mounting structure including a vessel having an electrical insulator covering the inside surface of the vessel. A heat conducting structure for mounting electronic circuits includes separable segments having surface areas contoured to match an inside surface of the electrical insulator. Electronic circuits are mounted on the heat conducting structure. The separable segments of the heat conducting structure are inserted into the vessel as a unit with resilient devices interposed between the segments for pressing their contoured surface areas into intimate contact with the inside surface of the electrical insulator.

BRIEF DESCRIPTION OF THE DRAWING

A better understanding of the invention may be derived by reading the detailed description following with reference to the appended drawing wherein.

DETAILED DESCRIPTION

Figure 1:
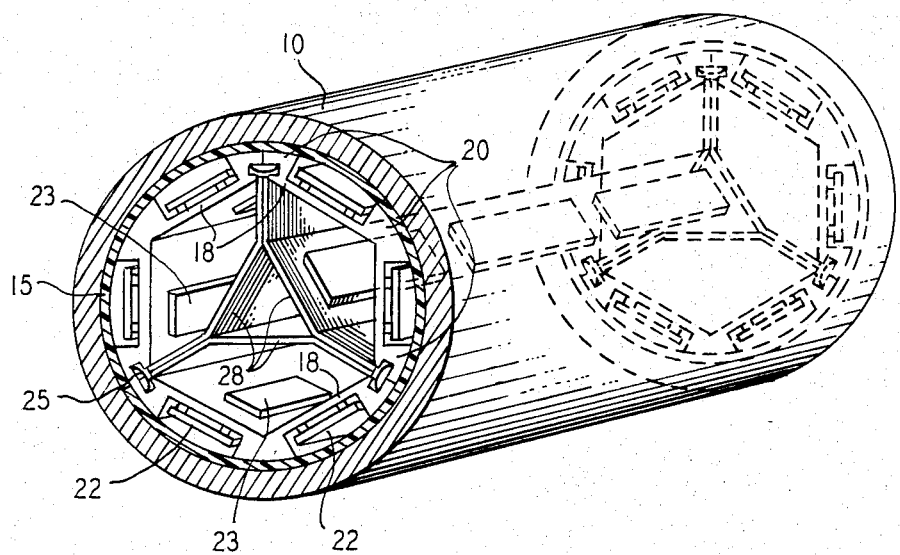
FIG. 1 is an isometric view of a repeater housing and electronic circuit mounting structure.

Referring now to FIG. 1, there is shown a repeater housing and mounting structure to be used as an enclosure either for electronic circuits in an undersea lightguide transmission system or for other electronic circuits requiring a pressure or water tight environment and high voltage isolation with low temperature rise. A vessel 10 is fabricated out of a high strength material, such as beryllium copper, aluminum, or steel.

For the undersea system repeater, beryllium copper is used to make the vessel 10. The vessel is formed as a hollow cylinder having an outside diameter of approximately thirteen inches and a wall approximately one inch thick. Beryllium copper has a thermal conductivity of 2.7 watts per inch degree Centigrade which provides good heat transfer characteristics for dissipating heat from inside of the vessel 10 to the sea water that surrounds the outside of the vessel during operation.

During deployment and recovery operations and during long term service on the sea bottom, the vessel 10 is subject to many stresses and strains which tend to alter its size and shape.

While the transmission system is in operation, very high voltage is applied from the cable to power circuits operating within the vessel 10. Because of the high voltage and relatively good electrical conductivity of the vessel 10, it is necessary to electrically isolate the electronics and circuit mounting structure from the vessel which is at sea ground potential.

A layer of an electrical insulator 15 is applied to the inside surface of the vessel 10. A suitable insulator is a mica-filled epoxy having a dielectric breakdown strength of 400 volts per mil. The insulator 15 is applied uniformly on the inside surface of the vessel at a thickness to withstand expected high voltage but limited from any excessive thickness to maximize heat transfer through the insulator while providing the needed electrical insulation.

Thermal conductivity of the layer of insulation 15 is a relatively low 0.005 watts per inch degree Centigrade. Because of the low thermal conductivity of the insulation, it is desirable to dissipate heat from operating electronic circuits through as much surface area as possible. Also it is desirable for enhanced heat transfer to rely upon conducting heat directly to the layer of insulation 15 rather than relying upon convection.

A circuit mounting structure including three segments 18 is designed as a heat sink for operating circuits and as a heat conduit to the layer of insulation 15. Each segment 18 is fabricated out of a high conductivity material such as aluminum which has a thermal conductivity of 5.5 watts per inch degree Centigrade. Each segment 18 has three feet 20 with contoured surface areas which extend the length of the vessel 10. The contoured, or curved, surfaces are shaped to fit snugly against the inside, or exposed, side of the layer of insulation 15.

Each segment 18 is channelled along the side facing the layer of insulation. A planar surface is provided in the channel for mounting electronic circuits 22. The planar surface on the back side is also used for mounting electronic circuits, for example, laser transmitters 23. When those circuits operate, they generate heat which is conducted through the associated mounting segment, its feet, and the layer of insulation to the vessel 10.

The segments 18 are dimensioned so that free space exists between adjacent ones of them, allowing them to be free of stress when the vessel 10 is at its minimum expected size at sea bottom pressure.

Resilient devices 25 are interposed between adjacent segments 18 for pushing them apart and pressing the curved surfaces of the feet into intimate contact with the inside surface of the layer of insulation 15. Regardless of whether the vessel 10 expands or contracts during deployment and recovery operations or during continuous system operation at sea bottom, the curved surfaces of the feet are held firmly in intimate contact with the inside surface of the layer of insulation 15.

A delta shaped mounting structure includes three similarly shaped chassis covers 28, each of which is attached to a different one of the segments 18. Each chassis cover 28 includes additional planar surfaces for mounting additional electronic circuits. Low heat generating circuits and circuits whose long term reliability is less sensitive to temperature are mounted to the delta shaped structure. Conduction and some convection cooling are sufficient to maintain those circuits at an ambient temperature in which they can operate for the expected life of the system without failure.

Figure 2:
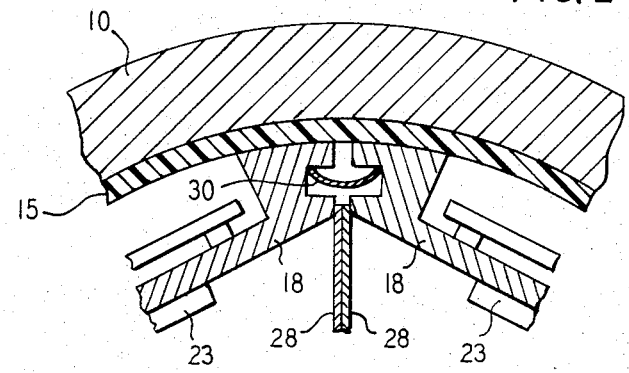
FIG. 2 is a fragmentary cross-sectional view of FIG. 1 showing a mounting structure detail.

Referring now to FIG. 2, there is shown a detail of one of the resilient devices 25 of FIG. 1. In FIG. 2 it is shown as a leaf spring 30 interposed with a bend between two segments 18. The spring 30 pushes the segments 18 apart and presses the curved surfaces against the layer of insulation 15. This assures good thermal conductivity between the segments 18 and the layer of insulation.

Figure 3:
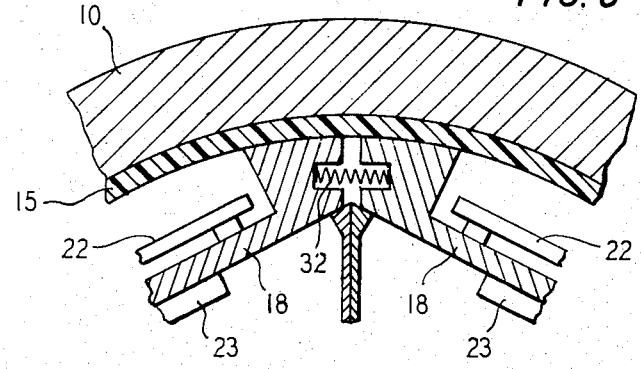
FIG. 3 is a fragmentary cross-sectional view showing an alternative mounting structure detail for FIG. 1.

Referring now to FIG. 3, there is shown another detail of one of the resilient devices 25 of FIG. 1. In FIG. 3 the resilient device is shown as a coiled spring 32 which is interposed in compression between the segments 18. Spring 32 also pushes the segments apart and presses the curved surfaces of the feet of the segments 18 into intimate contact with the layer of insulation 15 for assuring good thermal conduction.

Figure 4:
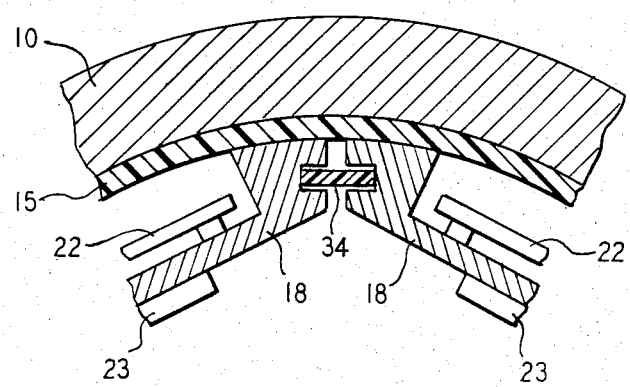
FIG. 4 is a fragmentary cross-sectional view showing another alternative mounting structure detail for FIG. 1.

Referring now to FIG. 4, there is shown still another detail of one of the resilient devices 25 of FIG. 1. In FIG. 4 the device 34 is a piece of resilient elastomer that is interposed in compression between the segments 18. The device 34 pushes the segments apart and presses the curved surfaces of the feet of the segments 18 snugly against the layer of insulation 15 for assuring good thermal conduction from the segments through the layer of insulation to the vessel 10.

Figure 5:
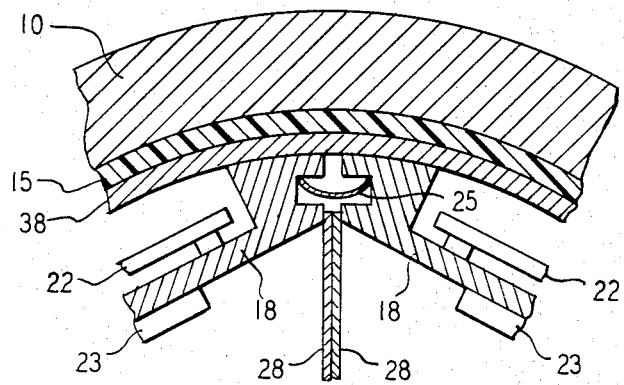
FIG. 5 is a fragmentary cross-sectional view of a repeater housing and electronic circuit mounting structure arranged with electromagnetic shielding.

Referring now to FIG. 5, there is shown a fragmentary cross-sectional view of an alternative repeater housing and electonic circuit mounting arrangement. In FIG. 5, elements which are similar to elements found in FIG. 1 are identified by the same designator. Thus a vessel 10 is lined with a layer of insulation 15. A thin cylindrical sleeve 38 of an electromagnetic shielding material is inserted inside of and in close contact with the layer of insulation. A metal such as aluminum can be used advantageously for the sleeve 38. A sleeve having a thickness of ⅛ inch has been used satisfactorily in practice.

It should be noted that the sleeve 38 increases the contact surface between the high thermal conducting materials of the segments 18 and the layer of electrical insulator 15. Although only shown in FIG. 5, the use of an electromagnetic shield 38 can also be utilized in the alternative arrangments of FIGS. 2, 3 and 4.

The foregoing describes several embodiments of the invention. Those embodiments together with others made obvious in view thereof are considered to be within the scope of the invention.

What is claimed is:

1. A repeater housing and electronic circuits mounting structure comprising
   a vessel having an electrical insulator in intimate contact with and covering an inside surface of the vessel;
   a heat conducting structure including plural segments, each segment being configured for mounting electronic circuits and having surface areas contoured to match an inside surface of the electrical insulator;
   electronic circuits affixed to the segments for dissipating heat during operation; and
   leaf spring means positioned between the segments for pushing the segments apart and pressing the contoured surface areas of the segments into intimate contact with the inside surface of the electrical insulator to provide a high thermal conductivity path from the electronic circuits through the segments to the electronic insulator.

2. A repeater housing and electronic circuits mounting structure comprising
   a vessel having an electrical insulator in intimate contact with and covering an inside surface of the vessel;
   a heat conducting structure including plural segments, each segment being configured for mounting electronic circuits and having surface areas contoured to match an inside surface of the electrical insulator;
   electronic circuits affixed to the segments for dissipating heat during operation; and
   compressed coil spring means positioned between the segments for pushing the segments apart and pressing the contoured surface areas of the segments into intimate contact with the inside surface of the electrical insulator to provide a high thermal conductivity path from the electronic circuits through the segments to the electrical insulator.

3. A repeater housing and electronic circuits mounting structure comprising
   a vessel having an electrical insulator in intimate contact with and covering an inside surface of the vessel;
   a heat conducting structure including plural segments, each segment being configured for mounting electronic circuits and having surface areas contoured to match an inside surface of the electrical insulator;
   electronic circuits affixed to the segments for dissipating heat during operation; and
   compressed elastomer means positioned between the segments for pushing the segments apart and pressing the contoured surface areas of the segments into intimate contact with the inside surface of the electrical insulator to provide a high thermal conductivity path from the electronic circuits through the segments to the electrical insulator.

4. A repeater housing and electronic circuits mounting structure comprising
   a vessel having an electrical insulator in intimate contact with and covering an inside surface of the vessel;
   an electromagnetic shield in intimate contact with and covering an inside surface of the electrical insulator;
   a heat conducting structure including plural segments, each segment being configured for mounting electronic circuits and having surface areas contoured to match an inside surface of the electromagnetic shield;

electronic circuits affixed to the segments for dissipating heat during operation; and compressed spring means positioned between the segments for pushing the segments apart and pressing the contoured surface areas of the segments into continuous intimate contact with the inside of the electromagnetic shield to provide a high thermal conductivity path from the electronic circuits through the segments and the electromagnetic shield to the electrical insulator regardless of expansion or contraction of the vessel.

* * * * *